(12) United States Patent
Shigeto et al.

(10) Patent No.: US 6,797,060 B2
(45) Date of Patent: Sep. 28, 2004

(54) METHOD AND APPARATUS FOR PRODUCING SILICON CARBIDE SINGLE CRYSTAL

(75) Inventors: Masashi Shigeto, Chiba (JP); Kotaro Yano, Chiba (JP); Nobuyuki Nagato, Chiba (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/310,913

(22) Filed: Dec. 6, 2002

(65) Prior Publication Data

US 2003/0116084 A1 Jun. 26, 2003

Related U.S. Application Data (62) Division of application No. 09/748,387, filed on Dec. 27, 2000, now Pat. No. 6,514,338.
(60) Provisional application No. 60/177,222, filed on Jan. 21, 2000.

(30) Foreign Application Priority Data

Dec. 27, 1999 (JP) .......................................... 11-370460

(51) Int. Cl.$^7$ ............................................. C30B 35/00
(52) U.S. Cl. ....................................................... 117/200
(58) Field of Search .......................................... 117/200

(56) References Cited

U.S. PATENT DOCUMENTS 5,683,507 A  * 11/1997  Barrett et al. ................ 117/200
5,707,446 A  *  1/1998  Volkl et al.

(List continued on next page.)

FOREIGN PATENT DOCUMENTS

| JP | S51-8400 B | * | 3/1976 | |
| JP | H6-1208094 A | * | 5/1994 | |
| JP | H6-316499 A | * | 11/1994 | |
| JP | 11116398 | * | 4/1999 | ........... C30B/29/36 |

OTHER PUBLICATIONS

WPI English abstract, abstracting JP–S51–8400 of Mar. 16, 1976.*
Patent Abstracts of Japan, abstracting JP–H6–316499 of Nov. 15, 1994.*
Patent Abstracts of Japan, abstracting JP–H6–128094 of May 10, 1994.*

*Primary Examiner*—Nadine G. Norton
*Assistant Examiner*—Matthew Anderson
(74) *Attorney, Agent, or Firm*—Sughrue Mion, PLLC (57) ABSTRACT

Silicon carbide single crystal is produced by allowing a silicon raw material to continuously react with a carbon raw material to generate gas, which reaches a seed crystal substrate on which a silicon carbide single crystal grows. Preferably, the silicon raw material is continuously fed onto the carbon raw material placed in a reaction crucible, and the carbon raw material is maintained at a temperature such that carbon is allowed to react with silicon in a molten state or a gaseous state to generate the reaction gas. An apparatus used for producing the silicon carbide single crystal comprises a reaction crucible, and a seed crystal substrate disposed in the reaction crucible; and further comprises means for maintaining the carbon raw material placed in the reaction crucible at a temperature such that carbon is allowed to react with silicon in a molten state or a gaseous state to generate the reaction gas, and means for continuously feeding the silicon raw material onto the carbon raw material placed in the reaction crucible.

8 Claims, 4 Drawing Sheets

U.S. PATENT DOCUMENTS

| | | | | |
|---|---|---|---|---|
| 5,873,937 A | * | 2/1999 | Hopkins et al. | |
| 5,937,317 A | * | 8/1999 | Barrett et al. | |
| 5,964,944 A | * | 10/1999 | Sugiyama et al. | |
| 5,968,261 A | * | 10/1999 | Barrett et al. | |
| 5,968,265 A | * | 10/1999 | Stein et al. | |
| 5,972,109 A | * | 10/1999 | Hunter | 117/204 |
| 5,985,024 A | * | 11/1999 | Balakrishna et al. | |
| 6,045,613 A | * | 4/2000 | Hunter | |
| 6,048,398 A | * | 4/2000 | Vehanen et al. | |
| 6,086,672 A | * | 7/2000 | Hunter | |
| 6,110,279 A | * | 8/2000 | Kito et al. | |
| 6,193,797 B1 | * | 2/2001 | Shiomi et al. | 117/88 |
| 6,261,363 B1 | * | 7/2001 | Vodakov et al. | |
| 6,344,085 B2 | * | 2/2002 | Kuhn et al. | |

* cited by examiner

METHOD AND APPARATUS FOR PRODUCING SILICON CARBIDE SINGLE CRYSTAL

CROSS-REFERENCE TO RELATED APPLICATIONS

This is a divisional of application Ser. No. 09/748,387 filed Dec. 27, 2000 now U.S. Pat. No. 6,514,338 which claims benefit of Provisional Application No. 60/177,222 filed Jan. 21, 2000; the above noted prior applications are all hereby incorporated by reference.

BACKGROUND OF THE INVENTION (1) Field of the Invention

This invention relates to a method and an apparatus for producing a silicon carbide single crystal. More particularly, it relates to a method and an apparatus for producing a silicon carbide single crystal wherein a silicon raw material is allowed to continuously react with a carbon raw material to generate gas, from which a silicon carbide single crystal grows.

The silicon carbide single crystal thus-produced has a large size and a high quality.

(2) Description of the Related Art

A silicon carbide single crystal expected for use as a semiconductor material is usually produced by a sublimation method using silicon carbide powder as a raw material. In the sublimation method, the raw material silicon carbide powder and a seed crystal substrate are disposed so as to face each other in a graphite reaction crucible, and the silicon carbide raw material is heated to a temperature in the range of 1,800° C. to 2,400° C. in an inert gas atmosphere. Sublimate gas of the silicon carbide generated by heating reaches the seed crystal substrate maintained at a temperature suitable for crystal growth, on which a silicon carbide single crystal grows. Sublimate gas components vary during the process of single crystal growth due to the sublimation and decomposition process of the silicon carbide powder as a raw material, and further mutual contact in the vapor phase and reaction of the sublimate gas components with graphite constituting the inner wall of the reaction crucible. As a method for suppressing and correcting such variation, a method for disposing a silicon raw material and a carbon raw material separately, and reacting gas components generated from the silicon raw material with the carbon raw material was proposed in, for example, Japanese Unexamined Patent Publication No. H6-316499.

Another proposed method is one for using silicon as a raw material, heating to evaporate silicon in the reaction crucible, reacting the generated silicon gas with carbon gas generated by evaporating the inner wall carbon of the reaction crucible, moving these to a silicon carbide deposition chamber, where a silicon carbide single crystal is deposited on the inner wall thereof (for example, Japanese Examined Patent Publication No. S51-8400). In the sublimation method, Si, $Si_2C$, $SiC_2$ and SiC are generated as sublimate and decomposed gases from the silicon carbide raw material, and composition of each of these sublimate gases varies in the sublimation process due to various factors. When the silicon carbide raw material is heated, the silicon component having a high vapor pressure is easily changed into gas, and the carbon remain conversely as a residual component. Consequently, with the passage of time, the silicon component in the raw material is reduced, and the gas composition in the sublimate gas is changed. This is one of the factors causing variation in the composition of the sublimate gas. A sublimation temperature of the raw material, a raw material composition, and a temperature distribution in the reaction crucible are also considered as other factors of variation. In the crystallization process of chemical species constituting the foregoing sublimate gas compositions to silicon carbides, reaction schemes are naturally different. Thus, the variation in the sublimate gas compositions in the single crystal growth process is considered to cause a reduction in a crystallinity by inclusion of a crystal defect in a crystal, and polymorphism intrusion. Therefore, to obtain a high-quality silicon carbide single crystal, the method of controlling such factors of variation is important.

In the present situation, however, since it is difficult to effect crystal growth by suppressing these factors to certain extents, the quality and stability of the silicon carbide single crystal obtained by the sublimation method, i.e., the method using the silicon carbide as a raw material are not satisfactory.

Also, to obtain a highly pure and high-quality single crystal for a semiconductor, it is necessary to use highly pure silicon carbide powder as a raw material, but the difficulty and high costs of obtaining such highly pure one are problems.

In a method using the silicon carbide powder as a raw material, a limitation is also placed on the weight of silicon carbide fed into the reaction crucible depending on a size of the reaction crucible. If the raw material is exhausted, batch processing of temporarily suspending the growth, lowering the temperature of the reaction crucible and then adding a new silicon carbide raw material must be carried out. Even if the silicon carbide raw material is fed without lowering the temperature of the reaction crucible, generally, a silicon component in the silicon carbide raw material is easily sublimated, decomposed or evaporated, and, with a progress of the sublimation, a carbon component is left. Consequently, continuous feeding of silicon carbide raw materials in the reaction crucible becomes impossible because of a capacity limitation of the reaction crucible.

In Japanese Unexamined Patent Publication No. H6-316499, silicon carbide is formed by allowing silicon to react with carbon, and then this silicon carbide is sublimated to form a silicon carbide single crystal. But an intrinsic drawback of the sublimation method, i.e., a change of a gas composition with the sublimation, is inevitable. In addition, a production method comprises two steps, and production time becomes relatively long. On the other hand, to continuously grow a crystal, the step of growing a crystal by elevating a temperature of the reaction crucible after the step of producing silicon carbide from silicon and carbon is repeated in batchwise fashion as in the case of the sublimation method. But because of an increasing or decreasing the temperature of the reaction crucible corresponding to each step, the crystal growth is not stable, and there is a possibility of causing distortion.

On the other hand, in the method of the above mentioned Japanese Examined Patent Publication No.S51-8400, silicon is used as a raw material, and silicon carbide is produced from silicon vapor produced therefrom and carbon vapor generated from the inner wall of the reaction crucible. But carbon has a low vapor pressure as compared with that of the silicon, and thus there is a drawback of a slow growth rate of a silicon carbide single crystal. In addition, since the carbon vapor generated from the inner wall of the reaction crucible is utilized for growth, if crystal growth is continued for a long time, the inner wall of the reaction crucible is reduced in thickness and, consequently, the crystal growth cannot be performed in continuous fashion.

SUMMARY OF THE INVENTION

An object of the invention is to provide a method for continuously growing a high-quality silicon carbide single crystal on a seed crystal substrate with good stability by continuously performing a reaction between silicon and carbon.

Another object of the invention is to provide an apparatus used for carrying out the above-mentioned method of the invention.

The present inventors made researches into the method for continuously growing a silicon carbide single crystal by utilizing gas generated by reacting silicon with carbon, and found that a high-quality silicon carbide single crystal can be obtained with little intrusion of elements or compounds other than the silicon carbide by continuous and quantitative feeding of silicon from the outside into a reaction crucible where silicon is placed into contact with carbon.

Thus, in one aspect of the present invention, there is provided a method for producing a silicon carbide single crystal comprising allowing a silicon raw material to continuously react with a carbon raw material to generate gas, which reaches a seed crystal substrate on which a silicon carbide single crystal grows.

In another aspect of the present invention, there is provided a method for producing a silicon carbide single crystal comprising allowing a silicon raw material to react with a carbon raw material in a reaction crucible to generate reaction gas, that reaches a seed crystal substrate on which a silicon carbide single crystal grows, characterized in that the silicon raw material is continuously fed onto the carbon raw material which is maintained at a temperature such that carbon is allowed to react with silicon in a molten state or a gaseous state to generate the reaction gas.

In the above-mentioned methods, it is preferable that the silicon raw material of a finely divided particle form is fed onto the carbon raw material of a finely divided particle form, and that the carbon raw material is maintained at a temperature of 1,900° C. or higher. The generated gas is preferably passed through an additional carbon material to the seed crystal substrate, said additional carbon material being disposed midway along a path of the generated gas reaching the seed crystal substrate.

In a further aspect of the present invention, there is provided an apparatus for producing a silicon carbide single crystal comprising a reaction crucible, and a seed crystal substrate disposed in the reaction crucible, on which substrate a silicon carbide single crystal grows, said apparatus further comprising means for maintaining a carbon raw material placed in the reaction crucible at a temperature such that carbon is allowed to react with silicon in a molten state or a gaseous state to generate the reaction gas, and means for continuously feeding a silicon raw material onto the carbon raw material placed in the reaction crucible.

The apparatus of the present invention preferably further comprises means for feeding the silicon raw material of a finely divided form onto the carbon raw material of a finely divided form; or means for placing an additional carbon raw material thereon, which is disposed midway along a path of the generated gas reaching the seed crystal substrate; or means for feeding the carbon material from the outside of the reaction crucible.

DESCRIPTION OF THE PREFERRED EMBODIMENTS

Description will be made of a production apparatus used for an embodiment of the invention.

Figure 1:
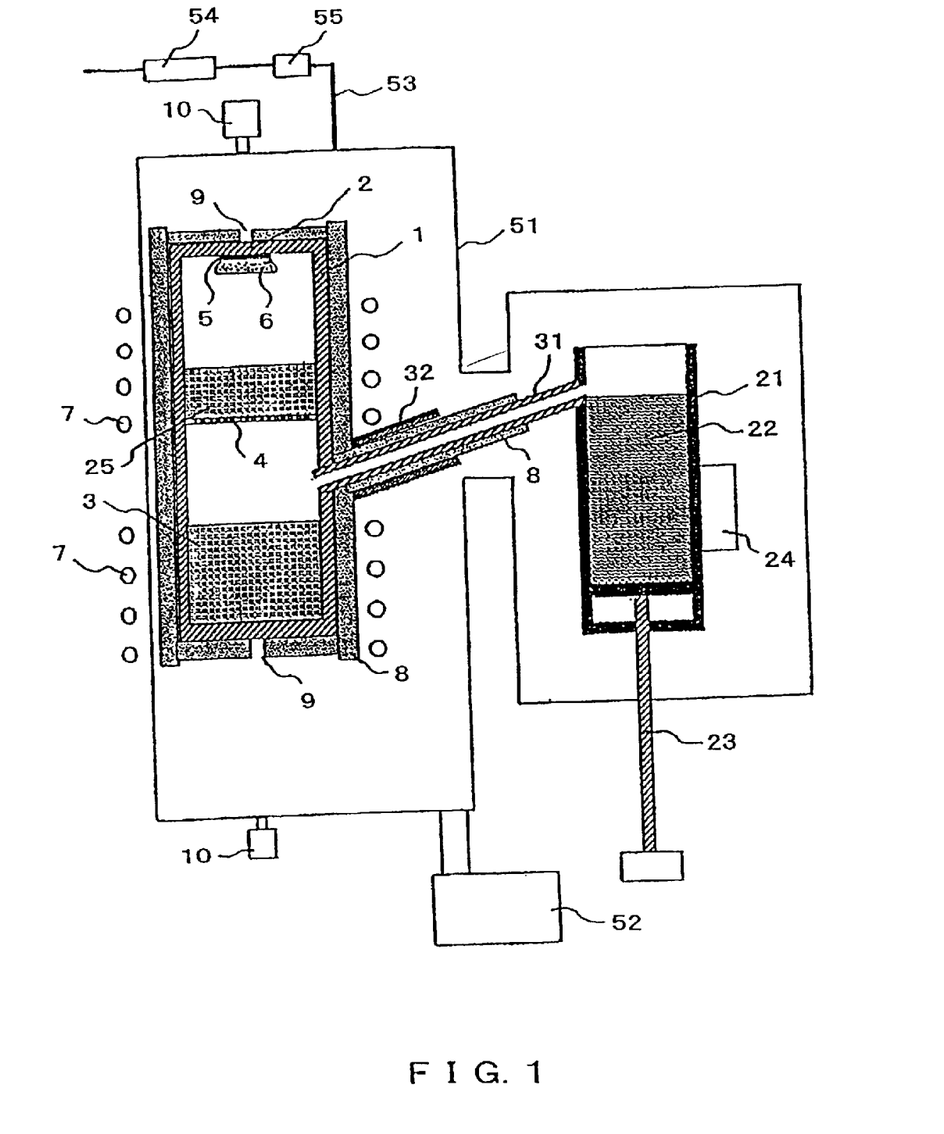
FIG. 1 is a schematic view showing an example of a single crystal production apparatus of the invention, to which a silicon raw material feeder is attached.

In FIG. 1, a reference numeral 1 denotes a reaction crucible made of graphite, and the reaction crucible 1 has a cover plate 2. Materials for the reaction crucible 1 and the cover plate 2 should preferably be graphite. If much higher purity is required of the materials, graphite having been treated with halogen gas for refining should preferably be used. A lower part inside the reaction crucible 1 has a size capable of storing an excessive quantity of a carbon raw material during crystal growth with respect to the quantity of a silicon raw material 22 continuously fed by a later-described method. For example, a capacity of storing a carbon raw material larger by twice (molar ratio) than the quantity of a silicon raw material should preferably be provided. A reference numeral 3 denotes a carbon raw material stored in the lower part of the reaction crucible 1.

A silicon carbide seed crystal substrate 5 is fixed to the inner face of the cover plate 2 within the reaction crucible 1. For this fixing, a mechanical connecting method, a bonding method by an adhesive, or the like can be used. For the seed crystal substrate 5 to be fixed, a seed crystal substrate fabricated by machining a silicon carbide single crystal obtained by an Acheson method, or a silicon carbide single crystal of a plate form obtained by a sublimation method or the present method can be used. A seed crystal substrate machined so as to shift a direction of its crystal face from (1000) face can also be used. A reference numeral 6 denotes a silicon carbide single crystal grown on the seed crystal substrate.

Outside the reaction crucible 1, a high-frequency coil 7 is installed as a heater for heating the reaction crucible 1. The heater 7 is a device capable of setting a temperature of the carbon raw material in the reaction crucible at a temperature for reacting the silicon raw material molten or partially gasified with the carbon raw material to generate gas, for instance, 1,900° C. or higher. Another heater based on a resistance heating system may be employed. To maintain a high-temperature state, the reaction crucible 1 is covered with a heat insulating material 8 made of a carbon fiber. In the vicinities of positions outside the reaction crucible, which correspond to the respective disposing positions of the carbon raw material and the seed crystal substrate disposed to be heated in the reaction crucible 1, in FIG. 1, high-frequency induction coils are disposed in divided fashion. As a result, for example, by adjusting the position of each high-frequency induction coil 7 and a current supplied to each high-frequency induction coil, a temperature distribution among the carbon raw material 3, the silicon carbide seed crystal substrate 5 disposed to be heated in the reaction crucible and other places inside the reaction crucible can be set in a desired state. As another method for controlling the temperatures of the respective places in the reaction crucible 1, for example in a high-frequency furnace, a method for adjusting a coil winding density of a high-frequency induction coil in the vicinity of the position outside the reaction crucible corresponding to each disposing position can be used.

To measure the temperature of the reaction crucible 1, temperature measurement holes 9 are provided in places necessary for temperature measurement, e.g., in the heat insulating material 8 covering the bottom surface and the cover plate of the reaction crucible 1, and a surface temperature of the reaction crucible 1 is measured by using a radiation thermometer 10 through these holes. On the basis of a result of the temperature measurement, by adjusting the position of each high-frequency induction coil 7 and a current supplied to the high-frequency induction coil 7, a temperature distribution among the foregoing places can be set in a desired state.

The silicon raw material 22 is stored in a raw material container 21 beforehand. The silicon raw material 22 has a form, such as a finely divided particle form, suitable for employing a fixed-quantity feeder mentioned below. Any material can be used for the raw material container 21 as long as it can be machined in a specified shape, and contains no impurities, for example metal such as stainless steel can be used.

An extrusion type fixed-quantity feeder 23 is attached to this raw material container 21. Herein, the fixed-quantity feeder 23 is provided for the purpose of feeding the silicon raw material 22 into the reaction crucible 1 in fixed-quantity fashion. More specifically, a predetermined amount of the raw material 22 is fed to the reaction crucible 1 within a stated period of time. The fixed-quantity feeding capability of the feeder is to continuously feed the quantity of the carbon raw material 3 in the reaction crucible 1 to be maintained in an excessive state relative to that of the silicon raw material 22 in the same. The excessive state means a state where the silicon raw material 22 fed by later-described means onto the stored carbon raw material 3 is surrounded with the carbon raw material 3, and direct contact thereof with the inner wall of the reaction crucible 1 is prevented. For example, preferably, a quantity maintaining a state where the quantity of the carbon raw material 3 in the reaction crucible 1 is larger by 2 to 100 times, more preferably 2 to 10 times, (molar ratio) than that of the silicon raw material 22 in the same should be continuously fed. Conversion of this value into a mass of a practical unit can be calculated with 1 mol=28.09 g of silicon and 1 mol=12.01 g of carbon. For example, a state of 1.17 g to 58.5 g, preferably 11.7 g to 58.5 g of the silicon raw material relative to 50 g of the carbon raw material should preferably be maintained.

To maintain such an excessive state, it is only necessary to set a feeding rate of the silicon raw material 22 equal to or lower than a rate of reaction of the silicon raw material to be gasified. In the case of employing a feeding system by providing feeding intervals for a feeding method, this method can be realized by setting the quantity of one feeding operation equal to or lower than a value obtained by the product of a feeding interval and a gasifying rate (but, the quantity of one feeding operation must be within the range of maintaining the above-mentioned excessive state). The gasifying rate varies depending on crystal growth conditions, but the rate is set substantially to from 0.1 mg/s to 5 mg/s in the later-described working examples. For example, in the case of one feeding per 5 minutes, it is only necessary to control fixed-quantity feeding at from 0.03 g/number of times to 1.5 g/number of times. In this case, a feeding rate becomes from 0.36 g/hour to 18 g/hour. In any of the above cases, an initial feeding quantity can be fed by increasing the feeding rate within the range of maintaining the quantity of the carbon raw material in the reaction crucible in the excessive state relative to that of the silicon raw material. By using the foregoing ideas in accordance with a capacity of the feeder to be used and considering the shape of the raw material, a method for feeding the raw material can be decided.

Without any special limitation placed on the functions of the feeder of the silicon raw material, it is possible to use, for example, a feeder described in Chemical Engineering Handbook, p871 (5th revised edition, issued in 1988) such as a screw feeder, a fixed-quantity extrusion device and a vibration feeder, or applied devices thereof. As shown in FIG. 1, preferably, the fixed-quantity feeder having a vibrator 24 fixed thereto should be installed for smooth feeding by vibrating the raw material container 21. A raw material container and a feeder similar to the above can be used as a container and a feeder of the carbon raw material.

Here, maintenance of the respective raw materials in solid states in both of the raw material containers of the silicon and carbon raw materials is preferred, because a mechanism of the fixed-quantity feeder can be simplified, and the foregoing general-purpose device can be used. Accordingly, installing positions of the raw material containers are set, for example, in positions separated from the reaction crucible 1 placed in a high-temperature state. On the other hand, the molten silicon raw material can be quantitatively fed, but heating and thermal insulation of a feeding path and a quantitative method must be devised with consideration given to the points including maintenance of the molten state and selection of a quantitative feeder.

To feed the silicon raw material 22 from the raw material container 21 to the reaction crucible 1, the container 21 and the crucible 1 are connected to each other by an introduction pipe 31. The pipe 31 is preferably made of graphite. But, an introduction pipe made of quartz glass or silicon carbide is also usable depending on a temperature condition and, further, in a part having a sufficiently low temperature, an introduction pipe made of metal such as stainless steel can be used. An introduction pipe may be made of a composite material thereof. An outer portion of the introduction pipe 31 is covered with the heat insulating material 8 used for heat insulation. In addition, if there is electric discharging from the high-frequency induction coil 7, in order to prevent this, the introduction pipe 31 should preferably be protected by an insulator 32, for example, made of ceramic or quartz glass. A connecting position of the introduction pipe 31 is set in a position for feeding the silicon raw material 22 onto the carbon raw material 3 stored in the lower portion of the reaction crucible 1.

The reaction crucible 1, the heater 7, the raw material container 21, the feeder 23 and the introduction pipe 31 are installed in the hermetically sealed production apparatus 51. The production apparatus 51 has an exhauster 52 and, further, a gas refiner 54 is connected through a gas introduction line 53 to the production apparatus 51. The gas introduction line 53 has a gas controller 55. By adjusting the gas controller 55 and the exhauster 52, the quantity of gas introduced into the production apparatus 51 and the quantity of exhaust gas from the production apparatus 51 are controlled, and a pressure inside the production apparatus 51 is set to a specified pressure.

As shown in FIG. 1, an additional carbon raw material 25 can be disposed by providing a shelf of a graphite plate 4 between the seed crystal substrate 5 and the carbon raw material 3. In the graphite plate 4, through-holes are provided for passage of gas generated by reaction between the carbon raw material 3 stored in the lower portion of the reaction crucible 1 and the molten or gasified silicon. A perforated plate made of graphite having through holes may also be used. Since this additional carbon raw material 25 is disposed, gas predominantly comprised of silicon carbide is generated by the reaction of the silicon raw material fed into the reaction crucible with the carbon material stored in the lower portion thereof and, at the same time, if silicon gas is evaporated in a non-reacted state, passage of the silicon gas through the additional carbon raw material 25 enables the unreacted silicon gas to react with the carbon raw material. As a result, efficiency for stabilizing a gas composition can be increased. Moreover, since the unreacted silicon gas can be prevented from directly reaching the seed crystal substrate 5, inclusion of the silicon in a crystal can be suppressed, and quality of a grown crystal can be stabilized, realizing favorable situation.

Figure 2:
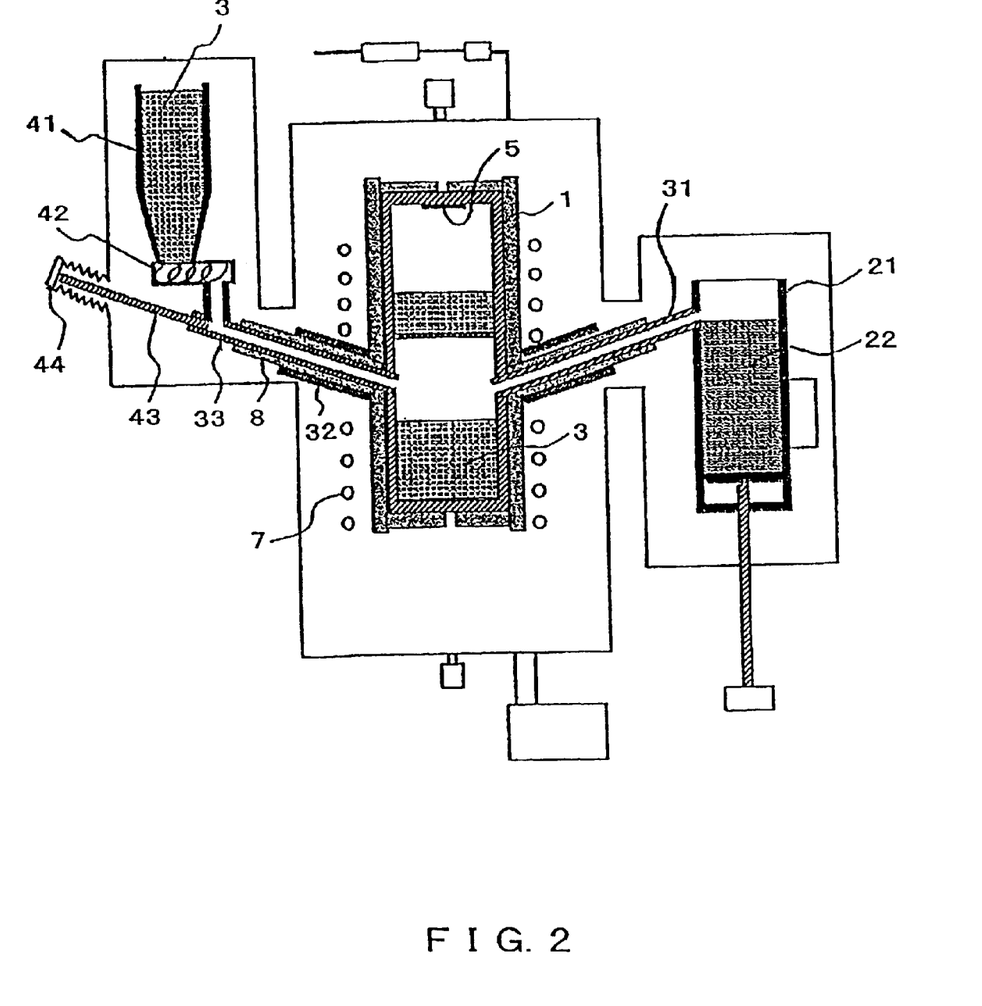
FIG. 2 is a schematic view showing an example of a single crystal production apparatus of the invention, to which a silicon raw material feeder and a carbon raw material feeder are attached.

FIG. 2 is a view showing an embodiment having a feeder installed to feed a carbon raw material to the apparatus of FIG. 1. For example, a carbon raw material 3 is stored in a carbon raw material container 41 of a stainless hopper type, and a fixed-quantity of the carbon raw material 3 is fed by a screw feeder 42. An introduction pipe 33 has a function of connecting the raw material container 41 with the reaction crucible 1 and feeding a raw material from the raw material container into the reaction crucible.

There is a possibility that gas predominantly comprised of a silicon carbide, which is generated in the reaction crucible, may partially flow into the introduction pipe 33, and consequently the silicon carbide may be deposited in a low-temperature portion in the pipe 33 to clog the introduction pipe. In FIG. 2, if the carbon raw material is intermittently fed, to prevent the clogging of the graphite introduction pipe 33 when the feeding is stopped, a mechanism is arranged to allow insertion of a graphite rod 43. Further, for the purpose of preventing the inability of movement caused by the deposition of the silicon carbide in a gap between the graphite introduction pipe 33 and the graphite rod 43, a rotating mechanism 44 is provided to rotate the carbon rod 43 when the feeding is stopped. Also, for the purpose of preventing the inability of movement caused by the deposition of the silicon carbide in the gap between the graphite introduction pipe 33 and the graphite rod 43, a function may be provided to cause a very small quantity of inert gas, e.g., argon gas, to flow between the introduction pipe 33 and the graphite rod 43. Further, these mechanisms can be used for the introduction pipe 31 for feeding the silicon raw material 22.

Figure 3:
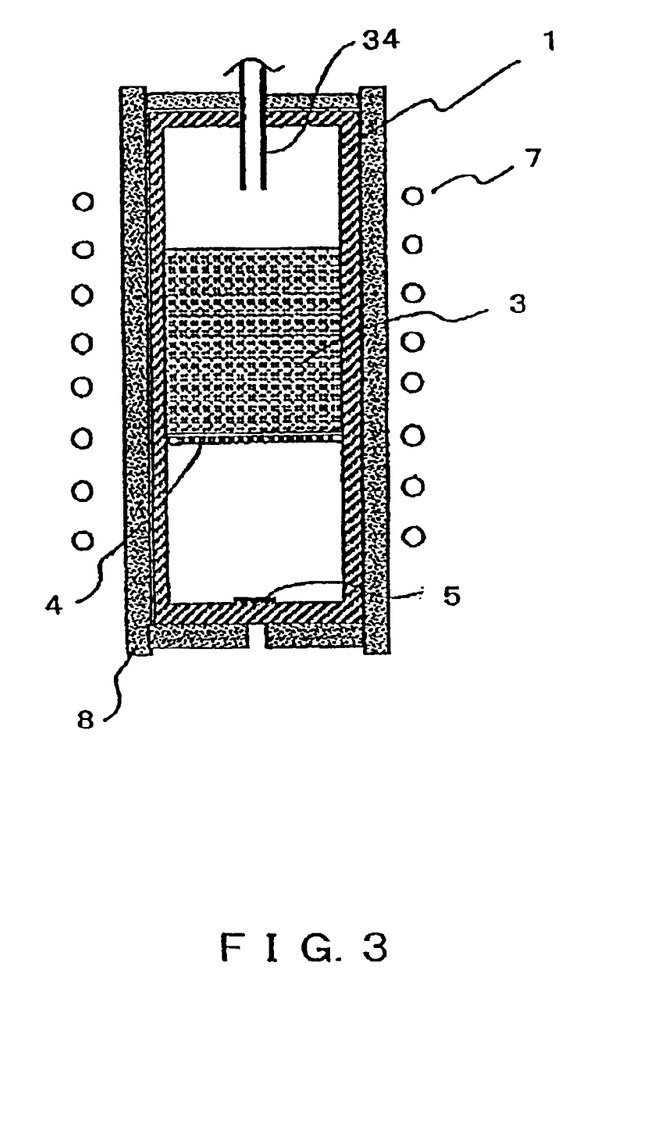
FIG. 3 is a schematic view showing an example of a reaction crucible used for the invention, which is different from the reaction crucible in the apparatus shown in FIG. 1 or FIG. 2.

FIG. 3 is a view showing another embodiment of reaction crucible. A seed crystal substrate 5 is disposed in the bottom of a reaction crucible 1, a carbon raw material 3 is disposed on a graphite plate 4 disposed in a position higher than the seed crystal substrate 5, the carbon raw material 3 is heated to the foregoing temperature, and a silicon raw material is fed onto the carbon raw material 3 through an introduction pipe 34 by using means (not shown) like that described above. In this case, a position for feeding the silicon raw material can be set in the center of the carbon raw material 3, and the effect of the invention can be further enhanced. Moreover, since the silicon raw material passes through the carbon raw material 3 to reach the seed crystal substrate 5, unreacted silicon gas can be prevented from directly reaching the seed crystal substrate 5.

Figure 4:
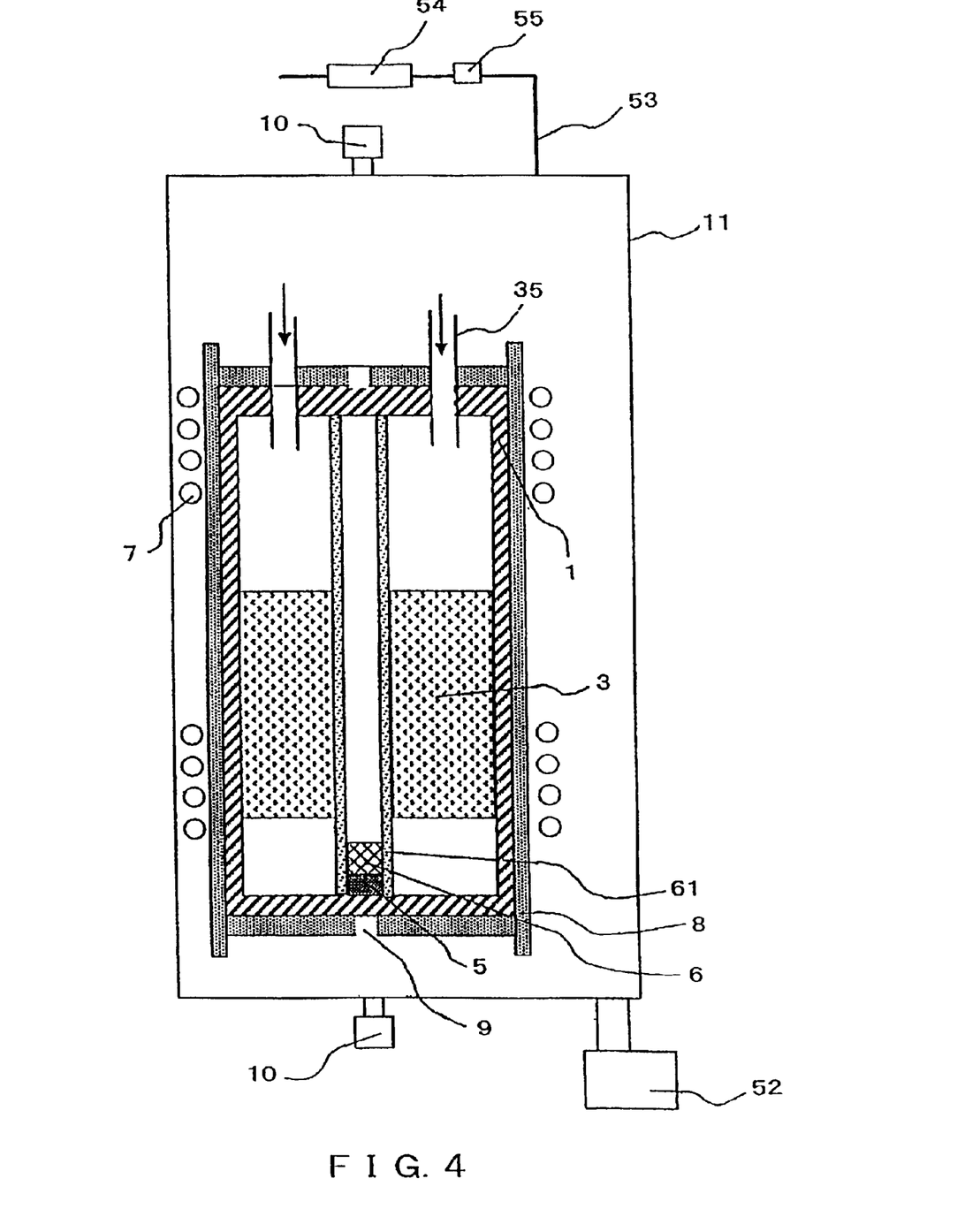
FIG. 4 is a schematic view showing another example of a reaction crucible used for the invention.

FIG. 4 is a view showing still another embodiment of reaction crucible. A seed crystal substrate 5 is disposed in the bottom of a reaction crucible 1. An inner tube 61 is disposed vertically in a position such that the tube surrounds the seed crystal substrate 5. The material of the inner tube 61 is not particularly limited provided that it is gas permeable. A carbon raw material 3 is placed between the wall of the reaction crucible 1 and the inner tube 61, and is heated to the above-mentioned temperature. A silicon raw material is fed onto the carbon raw material 3 by the above-mentioned feeding means (not shown in FIG. 4). In this embodiment, the distance between the seed crystal substrate 5 and the outlet of a silicon raw material-introducing pipe 35 can be large, and therefore, the temperature gradient falling down in the order of the silicon raw material-introducing pipe 35, the carbon raw material 3 and the seed crystal substrate 5 can easily be controlled so that the deposition of the silicon raw material on the inner wall of the introducing pipe 35 can be avoided, which leads to enhancement of the effect of the invention.

Next, description will be made of an embodiment of a crystal growth method of the invention using the apparatus shown in FIG. 1. The silicon raw material used in the invention is preferably in the form of a finely divided particle or powder suitable for quantitative feeding. For example, one obtained by crushing, spherical polysilicon or the like may be used. A size of the silicon raw material should preferably have an average particle diameter of 0.5 mm or larger. At an average particle diameter smaller than 0.5 mm, the powder easily flies up or is stuck to the inner wall of the feeding introduction pipe during feeding, which results in unstable feeding. Further, the particles or powder easily gets stuck to the inner wall of the reaction crucible to cause earlier wear of the inner wall of the reaction crucible. On the other hand, an average particle diameter capable of realizing accuracy corresponding to the foregoing quantity of feeding to be controlled can be set as an upper limit. For example, in the case of an average particle diameter where an average mass per powder particle exceeds 5 g, accuracy of fixed-quantity feeding becomes unstable easily. For example, in the case of the quantitative feeder of the extrusion type, its shape should preferably be spherical in order to facilitate transfer, and an average particle diameter should preferably be set in the range of 1 mm to 2 mm.

Since the silicon raw material suitable for the quantitative feeder is used as described above, even in the case of continuous feeding, the quantity of the carbon raw material in the reaction crucible is placed in an excessive state relative to the quantity of feeding the silicon raw material in the reaction crucible. For example, to realize the excessive state, preferably, the silicon raw material should be placed in a state where the quantity of the carbon raw material in the reaction crucible is larger by 2 to 100 times, more preferably 2 to 10 times and most preferably 3 to 10 times, (molar ratio) than the quantity of the silicon raw material. Out of the excessive state, control of the generation of reactive gas with the carbon raw material is not easy. Further, a possibility of contact of the molten silicon with the inner wall of the reaction crucible is increased. On the other hand, no special upper limit is set for the excessive state from the standpoint of the operation of the invention. But since the quantity of the carbon raw material unreacted with the silicon raw material is increased to deteriorate production efficiency, preferably 100 times, more preferably 10 times (molar ratio) should be set.

To obtain silicon carbide having high specific resistance to be used for the semiconductor, a commercially available semiconductor grade, for example, 99.999999 percent purity (hereinafter referred to as "8 nines purity") should be selected for the silicon raw material.

On the other hand, for effective reaction with the silicon raw material the carbon raw material used in the invention is also preferably in the form of finely divided particles or a powder. For example, one obtained by crushing is preferred. Also, one having an average particle diameter of 0.5 mm to 5 mm, preferably, 1 mm to 3 mm, is preferred, since transfer during feeding is easy and efficiency of reaction with the silicon raw material is increased. When necessary, to increase purity of the carbon raw material, a carbon raw material subjected to graphitization at a temperature of 2,500° C. or higher, and further subjected to high purification at 2000° C. or higher by using, for example, halogen gas should preferably be used.

In accordance with the invention, the reaction crucible 1 is heated to a temperature equal to or higher than a temperature at which the silicon raw material fed onto the carbon raw material and molted or partially gasified is allowed to react with the carbon raw material placed in the reaction crucible. Preferably, the carbon raw material in the reaction crucible should be heated to 1,900° C. or higher, more preferably 2,200° C. or higher, by which efficient reaction occurs between the silicon raw material and the carbon raw material. Setting of the carbon raw material at such a temperature causes the silicon raw material fed thereon to be melted in contact with the carbon raw material. Then, the silicon raw material infiltrates the carbon raw material, and is partially gasified to be easily brought into contact with the carbon raw material to react therewith. Reactive gas generated as a result reaches the seed crystal substrate to grow a silicon carbide single crystal. Heating is carried out preferably by a high-frequency heater to set a specified temperature.

In accordance with the invention, the silicon raw material is quantitatively fed onto the carbon raw material placed in the reaction crucible where the silicon raw material is heated to the above temperature or higher. An excessive quantity of the carbon raw material greater than the silicon raw material to be fed is set beforehand. The excessive setting of the quantity of the carbon raw material is for the following reasons. The fed silicon raw material can be efficiently reacted with the carbon raw material, and the unreacted silicon raw material can be prevented from reacting with the graphite reaction crucible. As a result, intrusion of impurities from the reaction crucible can be suppressed. In addition, the feeding of the fixed-quantity of the silicon raw material relative to the excessive carbon raw material enables a pseudo-primary reaction condition of excessive carbon to be established, a quantity of generated gas and a gas composition to be controlled in fixed fashion based on the quantity of feeding the silicon raw material, and control of the gas composition to be facilitated. As a result, quality of a grown crystal becomes uniform, and the occurrence of defects or distortion can be minimized.

The above operation is estimated as follows. The silicon raw material fed onto the heated carbon raw material is immediately melted, and the liquefied silicon infiltrates through the finely divided carbon raw material particles. In the method, the liquefied silicon raw material brought into contact with the surface of the carbon raw material is allowed to react with the carbon raw material to be gasified. Hereupon, since the quantity of the carbon raw material is greater than that of the silicon raw material, the silicon raw material is brought into contact with the carbon raw material to react therewith before reaching the wall face of the reaction crucible, and then gasified. As a result, the inner wall of the reaction crucible can be prevented from being eroded by the silicon raw material. Moreover, since the quantity of the carbon raw material is greater than that of the silicon raw material, the generation of reactive gas can be controlled based on the quantity of feeding the silicon raw material. This can be considered as so-called pseudo-primary reaction depending only on the quantity of feeding the silicon raw material. In other words, this can be considered as reaction reducing the factors of controlling reaction.

Growth mechanism of the silicon carbide single crystal, i.e, a mechanism of reacting the silicon fed on the carbon raw material with the carbon, and then growing a silicon carbide single crystal on the seed crystal substrate is complex. In accordance with the invention, however, since it can be estimated that the silicon raw material is melted in the carbon raw material, thus, the silicon raw material is liquefied and partially gasified to allow the silicon to react therewith, and thereby continuously generating reactive gas (in the vapor phase, in addition to the silicon carbide (SiC), other unreacted ingredients such as Si, $Si_2C$ and $SiC_2$ may exist). The process of producing the reactive gas in the invention is presented to be a pseudo-primary reaction on the basis of the quantity of feeding the silicon raw material, and thus, control of the gas composition can be facilitated more than in the conventional technique.

In accordance with the invention, a suitable range of a temperature of the seed crystal substrate is 1,500° C. to 2,500° C., preferably 1,700° C. to 2,300° C. If the substrate temperature is lower than 1,500° C., intrusion of polymorphism easily occurs in a grown crystal, or the crystal may not grow as a single crystal. In contrast, if the substrate temperature is higher than 2,500° C., various crystal defects easily occur. Also, polymorphism intrusion easily occurs. To grow a silicon carbide single crystal on the seed crystal substrate, a temperature of the carbon raw material must be set higher than that of the seed crystal substrate. The temperature difference therebetween should preferably be 100° C. from the standpoint of improving stability of the growth of crystal.

Distribution of such temperatures among the respective places in the reaction crucible can be realized by adjusting a position of the foregoing high-frequency coil and an electric current supplied to the high-frequency coil.

Production of a silicon carbide single crystal can be carried out by setting a total pressure (which is substantially the same as the total pressure in the reaction crucible and the raw material container) of the production apparatus from a high pressure reduction to a level slightly higher than the normal pressure, i.e., within the range of (0.01 to 1,000)× 133 Pa [Pa means Pascal unit, hereinafter]. Especially, to efficiently generate reactive gas, (1 to 300)×133 Pa is preferable.

By continuously feeding the silicon raw material until the carbon raw material is reduced while maintaining the foregoing state, crystal growth can be continued without any suspension for raw material feeding, i.e., cooling of the reaction crucible, and any temperature control in the reaction crucible for re-heating. As a result, it is possible to obtain a good-quality and long silicon carbide single crystal, where occurrence of defects and distortion is suppressed. Further, when the carbon raw material is allowed to react with the silicon whereby the amount thereof is reduced, for example, a longer silicon carbide single crystal can be obtained by separately feeding a carbon material as shown in FIG. 2.

As apparent from the foregoing, since control of a gas composition can be facilitated more than that of conventional one by feeding the silicon raw material according to the invention when optimal production conditions, such as conditions of a gas composition, a temperature in the reaction crucible, a pressure and an inert gas pressure, are adjusted in accordance with a capacity and a structure of the apparatus, a desired gas composition can be easily obtained. Further, maintenance of this control can be facilitated. Easy control and easy maintenance thereof enables a crystal to be grown in stable fashion for a long period of time. In addition, since the excessive state of the carbon raw material is maintained, intrusion of impurities from the inner wall of the reaction crucible can be suppressed. Maintenance of the excessive state enables wear of the inner wall of the reaction crucible to be minimized. As a result, it is possible to continuously grow a good-quality and large silicon carbide single crystal having no inclusions, i.e., intrusion of impurities, no boundaries or no distortion, on the surface of the silicon carbide substrate.

Instead of the silicon raw material, a mixture of finely divided silicon particles and finely divided carbon particles can be fed as a raw material onto the carbon raw material stored in the reaction crucible in such a way as to maintain the foregoing excessive state. For example, regarding raw material feeding, instead of storing the silicon raw material and the carbon raw material separately in the different raw material containers and then feeding these raw materials, the silicon and the carbon can be stored in mixed fashion in one raw material container, and then fed. This case is preferable, because it is not necessary to separately prepare the raw material container and the feeder.

Furthermore, impurity doping of a silicon carbide single crystal can be carried out as occasion demands. For example, it is possible to use a silicon raw material doped beforehand, or feed a doping element as gas.

The invention will now be described specifically by the following working examples that by no means limit the scope of the invention.

EXAMPLE 1

A silicon carbide single crystal was produced by using the apparatus shown in FIG. 1. A seed crystal substrate prepared by machining a hexagonal (6H)-silicon carbide (SiC) single crystal having (0001) face to have a diameter of 20 mm and a thickness of 2.0 mm was attached by adhesive to the center part of a reaction crucible inner side face of the cover plate (made of graphite) of the reaction crucible. The reaction crucible was made from graphite to be cylindrical having a bottom of an inner diameter of 5 cm and a height of 15 cm. A carbon raw material (65 g) was placed up to a position of a height of 4 cm from the lower end of the bottom of the reaction crucible. Further, a graphite perforated plate having a plurality of through-holes of diameters of 1 mm, and a thickness of 2 mm was installed in a position 4 cm above the foregoing position, and an additional carbon raw material was placed by about 2 cm on the perforated plate. For each carbon raw material, one having an average particle diameter of 2 mm and subjected to refining by halogen gas beforehand was used. Regarding a silicon raw material, highly pure spherical polysilicon (8 nines purity, average particle diameter of 2 mm) for a semiconductor was stored by long in a raw material container. The silicon raw material was fed from the raw material container through a graphite introduction pipe on to the carbon raw material placed in the lower part in the reaction crucible by using a fixed-quantity feeder of a vibration type.

The reaction crucible, the raw material container and the introduction pipe were installed in the production apparatus to be reduced for pressure. Heat treatment was executed to remove gas or other impurities stuck to the reaction crucible and others by setting a pressure of $10^{-3} \times 133$ Pa in the production apparatus, then elevating a temperature of the reaction crucible to 1,450° C. and maintaining this state for 30 minutes. Subsequently, a temperature of the carbon raw material placed in the lower part of the reaction crucible was elevated to about 2,300° C., a seed crystal temperature was elevated to 2,100° C., argon was introduced into the production apparatus, and crystal growth was conducted for 6 hours by setting argon atmosphere to a pressure of $50 \times 133$ Pa, and then the silicon raw material was continuously fed at a feeding rate of 10 g/hour.

After the end of the crystal growth, the cover plate of the reaction crucible was opened. It was found that in the cover plate of the reaction crucible, a single crystal was grown on the seed crystal substrate, and a polycrystal was simultaneously grown on its peripheral portion. A diameter of the tip portion of the grown silicon carbide single crystal was 22 mm, and a grown length was 4.2 mm. As a result of cutting a section of the growth direction of the single crystal, polishing this by means of polishing and then conducting microscope observation, no inclusions were found. By means of Raman spectroscopic measurement, it was also verified that the single crystal was 6H silicon carbide from a peak portion, and had no other polymorphism intrusions. Also, as a result of cutting a section in parallel with the growth direction and observing a grown section, it was found that no boundaries existed in the growth starting portion, which were seen in the batch type sublimation method, and crystal growth was uniform in the initial, middle and latter layers without any boundaries or distortion in the crystal.

Comparative Example 1

A silicon carbide single crystal was produced in the same manner as that in Example 1 except that the temperature of the carbon raw material placed in the lower part of the reaction crucible was elevated to about 1,800° C. and the seed crystal temperature was elevated to 2,100° C. It was found that the carbon raw material was converted into silicon carbide, but conversely sublimation partially occurred in the seed crystal without any growth of a silicon carbide single crystal observed on the seed crystal.

EXAMPLE 2

A silicon carbide single crystal was produced by using the apparatus shown in FIG. 2. A seed crystal substrate prepared by machining a 6H—SiC single crystal having (0001) face to have a diameter of 20 mm and a thickness of 2.0 mm was attached by adhesive to the center of the reaction crucible inner side face of the cover plate (made of graphite) of the reaction crucible. The reaction crucible was made from graphite to be cylindrical having a bottom of an inner diameter of 5 cm and a height of 15 cm. A carbon raw material (65 g) was placed up to a position of a height of 4 cm from the lower end of the bottom of the reaction crucible. Further, a graphite perforated plate having a plurality of through-holes of diameters of 1 mm and a thickness 2 mm was installed in a position 7 cm above the foregoing, and an additional carbon raw material was placed by about 2 cm on the perforated plate. For each carbon raw material, one having an average particle diameter of 2 mm and subjected to refining by halogen gas beforehand was used. Also, to replenish a carbon raw material in the midway, about 100 g was put into the raw material container for carbon raw material feeding.

For the silicon raw material, highly-pure spherical polysilicon (8 nines purity, particle diameter of 2 mm) for a semiconductor was stored by 200 g in each of raw material containers for silicon raw material feeding. Each raw material container with a fixed-quantity feeder of a vibration type was connected through a graphite introduction pipe to the reaction crucible.

The reaction crucible, the raw material container and the introduction pipe were installed in the production apparatus to be reduced for pressure. Heat treatment was executed to remove gas and other impurity ingredients stuck to the reaction crucible and others by setting a pressure of $10^{-3} \times 133$ Pa inside the production apparatus, then increasing the temperature of the reaction crucible to 1,450° C. and maintaining this state for 30 minutes. Subsequently, crystal growth was carried out continuously for 18 hours by elevating a temperature of the carbon raw material in the reaction crucible to about 2,300° C. and the seed crystal temperature to 2,100° C., introducing argon into the production apparatus, setting argon atmosphere to a pressure of $50 \times 133$ Pa, continuously feeding the silicon raw material at a feeding rate of 10 g/hour, and further feeding a carbon raw material onto the carbon raw material placed in the lower part of the reaction crucible by about 30 g every 6 hours. In this case, because growth time was long, in order to prevent the possible clogging of the introduction pipe, the graphite rod rotated when no raw materials were fed was inserted to each introduction pipe beforehand.

After the end of the growth, it was found that a single crystal and a polycrystal were simultaneously grown on the reaction crucible cover, a diameter of the tip portion of the silicon carbide single crystal was 25.5 mm, and a grown quantity was 13.4 mm. As a result of cutting a section of the growth direction of the single crystal, polishing this by means of polishing and carrying out microscope observation, it was found that no inclusions existed. Also, by means of Raman spectroscopic measurement, it was verified that the single crystal was 6H silicon carbide from a peak portion, and had no other polymorphism intrusions.

By the continuous growth of 18 hours, 180 g of the silicon raw material was fed. On the other hand, in the method of a batch type using the reaction crucible of an identical size, only about 150 g of the raw material was fed into the reaction crucible, but a greater quantity of the raw material was fed in continuous fashion in the invention. Moreover, as a result of cutting a surface in parallel with the growth direction and observing a grown section, it was found that no boundaries existed in the growth starting portion, which were seen in the batch type sublimation method, and crystal growth was uniform in the initial, middle and latter layers without any boundaries or distortion in the crystal.

EXAMPLE 3

A silicon carbide single crystal was produced by using the apparatus shown in FIG. 4, to which a silicon raw material-introducing mechanism similar to that shown in FIG. 1 was attached. A seed crystal substrate prepared by machining a 6H—SiC single crystal having (0001) face to have a diameter of 20 mm and a thickness of 2.0 mm was attached by adhesive to the center of the reaction crucible inner side face of the cover plate (made of graphite) of a reaction crucible. The reaction crucible was made from graphite to be cylindrical having a bottom of an inner diameter of 7.5 cm and a height of 20 cm. A graphite inner tube with slits was installed in the reaction crucible, and a shelf was provided in a position of a height of 3 cm from the bottom of the reaction crucible. A carbon raw material (90 g) was placed up to a height of about 5 cm on the shelf. The carbon raw material used was composed of graphite and had a primary particle size of 1 cm×1 cm×0.5 cm and was subjected to refining by halogen gas beforehand. Three graphite pipes for introducing a silicon raw material each having an inner diameter of 1.8 cm were installed at the upper part of the reaction crucible. For the silicon raw material, highly-pure spherical polysilicon (8 nines purity, average particle diameter of 2 mm) for a semiconductor was stored by 100 g in a raw material container. The raw material container was connected through the graphite introduction pipes with a fixed-quantity feeder of a vibration type to the reaction crucible.

The reaction crucible, the raw material container and the introduction pipes were installed in the production apparatus to be reduced for pressure. The inner pressure of the production apparatus was reduced to $10^{-3} \times 133$ Pa, argon was introduced to a pressure of $760 \times 133$ Pa, then the temperature of the upper part of the reaction crucible was elevated to 2,600° C. and the seed crystal temperature was elevated to 2,200° C. Then the inner pressure of the production apparatus was reduced to an argon atmosphere pressure of $200 \times 133$ Pa, then the silicon raw material was fed at a feeding rate of 2.4 g/hour for 5 hours to effect a crystal growth.

After the end of the growth, the cover plate was opened. It was found that a single crystal and a polycrystal were simultaneously grown on the seed crystal substrate fixed to the reaction crucible cover plate. The diameter of the tip portion of the silicon carbide single crystal was 20 mm, and a grown quantity was 0.5 mm in length. As a result of cutting a section of the growth direction of the single crystal, polishing this by means of polishing and carrying out microscope observation, it was found that no inclusions existed. Also, by means of Raman spectroscopic measurement, it was verified that the single crystal was 6H silicon carbide from a peak portion, and had no other polymorphism intrusions. Moreover, as a result of cutting a surface in parallel with the growth direction and observing a grown section, it was found that no boundaries existed in the growth starting portion, which were seen in the batch type sublimation method, and crystal growth was uniform in the initial, middle and latter layers without any boundaries or distortion in the crystal.

As seen from the above-mentioned working examples, in accordance with the method and the apparatus for producing a silicon carbide single crystal of the invention, impurities in the obtained silicon carbide single crystal, a discontinuous boundary of the crystal and distortion can be reduced. Moreover, compared with the batch type production method inevitable in the conventional sublimation method, continuous crystal growth can be performed, and production efficiency can be increased. Thus a silicon carbide single crystal having a high quality and a large size can be produced in an industrially advantageous manner.

What is claimed is:

1. An apparatus for producing a silicon carbide single crystal comprising a reaction crucible, and a seed crystal substrate disposed in the reaction crucible, on which substrate a silicon carbide single crystal grows, said apparatus further comprising:

means for holding carbon material of a finely divided particle form, means for maintaining the carbon raw material held in the reaction crucible at a temperature such that carbon is allowed to react with silicon in a molten state or a gaseous state to generate a reaction gas, and means for continuously feeding silicon raw material of a finely divided particle form during the reaction into the reaction crucible, said means comprising a silicon raw material-introducing pipe having an outlet opened within the reaction crucible, wherein said means for holding the carbon material of a finely divided particle form is disposed midway between the outlet of the silicon raw material-introducing pipe and the seed crystal substrate along a path of the generated gas reaching the seed crystal so that the generated gas passes through the carbon material of a finely divided particle form.

2. The apparatus according to claim 1, which further comprises means for feeding the carbon material during the reaction from the outside of the reaction crucible.

3. The apparatus according to claim 1, wherein the seed crystal substrate is placed at the top within the reaction crucible, and said apparatus further comprises a storage area for storing carbon raw material of a finely divided particle form placed at the bottom of the reaction crucible.

4. The apparatus according to claim 3, wherein said means for holding carbon material of a finely divided form comprises a perforated graphite plate for holding the carbon material on the graphite plate, disposed in a position higher than the storage area for storing carbon material of a finely divided particle form.

5. An apparatus for producing a silicon carbide single crystal comprising a reaction crucible, and a seed crystal substrate disposed in the reaction crucible, on which substrate a silicon carbide single crystal grows, the seed crystal substrate being placed on the bottom of the reaction crucible, said apparatus further comprising:

means for holding carbon material of a finely divided particle form, means for maintaining the carbon raw material held in the reaction crucible at a temperature such that carbon is allowed to react with silicon in a molten state or a gaseous state to generate a reaction gas, and means for continuously feeding silicon raw material of a finely divided particle form during the reaction into the reaction crucible, said means comprising a silicon raw material-introducing pipe having an outlet opened at an upper part within the reaction crucible, wherein said means for holding the carbon material of a finely divided particle form is disposed between the outlet of the silicon raw material-introducing pipe and the seed crystal substrate along a path of the generated gas reaching the seed crystal so that the generated gas passes through the carbon material of a finely divided particle form.

6. The apparatus according to claim 5, wherein said means for holding carbon material of a finely divided form comprises a perforated graphite plate for holding the carbon material on the graphite plate, disposed in a position higher than the seed crystal substrate.

7. An apparatus for producing a silicon carbide single crystal comprising a reaction crucible, and a seed crystal substrate disposed in the reaction crucible, on which substrate a silicon carbide single crystal grows, said apparatus further comprising:

means for holding carbon material of a finely divided particle form, means for maintaining the carbon raw material held in the reaction crucible at a temperature such that carbon is allowed to react with silicon in a molten state or a gaseous state to generate a reaction gas, means for continuously feeding silicon raw material of a finely divided particle form during the reaction into the reaction crucible, said means comprising a silicon raw material-introducing pipe having an outlet opened within the reaction crucible, and a gas permeable inner tube extending upwardly within the reaction crucible, wherein the seed crystal substrate is positioned within the gas permeable inner tube, the silicon raw material introducing pipe has an outlet opened between the outer wall of the gas permeable inner tube and the inner wall of the reaction crucible and at the upper part within the reaction crucible, and said means for holding the carbon material of a finely divided particle form is disposed between the outlet of the silicon raw material-introducing pipe and the seed crystal substrate so that the generated gas passes through the carbon material of a finely divided particle form and into the gas permeable inner tube.

8. The apparatus according to claim 7, wherein the means for holding carbon material of a finely divided particle form comprises a shelf for holding the carbon raw material between the outer wall of the gas permeable inner tube and the inner wall of the reaction crucible.

* * * * *